(12) United States Patent
Cho

(10) Patent No.: US 11,380,740 B2
(45) Date of Patent: Jul. 5, 2022

(54) DISPLAY PANEL AND DISPLAY DEVICE

(71) Applicants: HKC CORPORATION LIMITED, Shenzhen (CN); CHONGQING HKC OPTOELECTRONICS TECHNOLOGY CO., LTD., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 555 days.

(21) Appl. No.: 16/332,363

(22) PCT Filed: Jun. 25, 2018

(86) PCT No.: PCT/CN2018/092600
§ 371 (c)(1),
(2) Date: Mar. 12, 2019

(87) PCT Pub. No.: WO2019/148747
PCT Pub. Date: Aug. 8, 2019

(65) Prior Publication Data
US 2021/0335916 A1 Oct. 28, 2021

(30) Foreign Application Priority Data
Feb. 5, 2018 (CN) .......................... 201810122361.1

(51) Int. Cl.
*H01L 33/00* (2010.01)
*H01L 21/00* (2006.01)
(Continued)

(52) U.S. Cl.
CPC ...... *H01L 27/3227* (2013.01); *H01L 27/3244* (2013.01); *H01L 31/0384* (2013.01); *H01L 51/502* (2013.01)

(58) Field of Classification Search
CPC .......................... H01L 51/502; H01L 31/0384
(Continued)

(56) References Cited

U.S. PATENT DOCUMENTS 9,064,822 B2* 6/2015 Park .................... H01L 27/3216
10,854,837 B2* 12/2020 Kim .................... H01L 51/0096
(Continued)

FOREIGN PATENT DOCUMENTS

CN 105487724 A 4/2016
CN 105742320 A 7/2016
(Continued)

OTHER PUBLICATIONS

Zheng Jin, the ISA written comments, Oct. 2018. CN.
(Continued)

*Primary Examiner* — Calvin Lee

(57) ABSTRACT

The present application discloses a display panel and a display device. The display panel includes a substrate; an active switch, which is arrange on the substrate and includes a first active switch and a second active switch; a pixel, which is arrange on the substrate and coupled to the first active switch and includes a quantum dot light-emitting diode; and a light sensor, which is arrange on the substrate and coupled to the second active switch and includes a quantum dot light sensing layer.

17 Claims, 2 Drawing Sheets

(51) Int. Cl.
*H01L 27/32* (2006.01)
*H01L 31/0384* (2006.01)
*H01L 51/50* (2006.01)

(58) Field of Classification Search
USPC .......................................... 438/29–31; 257/98
See application file for complete search history.

(56) References Cited

U.S. PATENT DOCUMENTS

2008/0218068 A1* 9/2008 Cok ..................... H05B 33/145
313/505
2009/0280586 A1* 11/2009 Coe-Sullivan ...... H01L 21/6715
438/22

FOREIGN PATENT DOCUMENTS

| CN | 106257581 A | 12/2016 | | |
|---|---|---|---|---|
| CN | 107017325 A | 8/2017 | | |
| CN | 108376695 A | * | 8/2018 | ........... H01L 51/502 |
| CN | 108415193 B | * | 8/2018 | ......... G02F 1/13357 |
| CN | 108470747 A | * | 8/2018 | ......... H01L 27/3227 |

OTHER PUBLICATIONS

Jing Yang, the International Search Report, Oct. 2018, CN.
Dmitry n. dirin et al., harnessing defect-tolerance at the nanoscale: highly luminescent lead halide perovskite nanocrystals in me soporous silica matrixes, 16 5866-5874, nano letters, Aug. 2016, US.

* cited by examiner

DISPLAY PANEL AND DISPLAY DEVICE

TECHNICAL FIELD

The present application relates to the technical field of display, and in particular, to a display panel and a display device.

BACKGROUND

Existing displays are generally controlled based on active switches, and have many advantages such as thin bodies, power saving and no radiation, and have been widely used, mainly including a liquid crystal display, an organic light-emitting diode (OLED) display, a quantum dot light-emitting diode (QLED) display, a plasma display and the like. From the perspective of the appearance structure, there are flat displays and curved displays.

The liquid crystal display includes a liquid crystal panel and a backlight module. The working principle of the liquid crystal display is that liquid crystal molecules are placed between two parallel glass substrates and a driving voltage is applied on the two glass substrates to control the rotating direction of the liquid crystal molecules, so as to refract light of the backlight module to generate a picture.

For the OLED display, the self-illumination of an organic light-emitting diode is used for display, and the OLED display has the advantages of self-illumination, wide viewing angle, almost infinite contrast, low power consumption, and extremely high reaction speed and the like.

The structure of the QLED display is very similar to that of an OLED technology. The main difference is that a luminescent center of the QLED is composed of quantum dots. Its structure is that after two-side electrons and holes converge in a quantum dot layer, photons (exciton) are formed, and the QLED display emits light by recombination of the photons.

However, with the gradual development of liquid crystal display (LCD) products, how to make LCDs have better performance has become the direction of thinking and improvement. An example is how to make better use of the quantum dot technology.

It should be noted that the above description of the technical background is only for the purpose of facilitating a clear and complete description of the technical solutions of the present application, and facilitates understanding by a person skilled in the art. Although these solutions are set forth in the background section of the present application, it should not be considered simply that the above technical solutions are known to a person skilled in the art.

SUMMARY

An objective of the present application is to provide a display panel that can better adjust the display.

To solve the above problem, the present application provides a display panel, which includes:

a substrate;

an active switch, which is disposed on the substrate and includes a first active switch and a second active switch;

a pixel unit, which is disposed on the substrate and coupled to the first active switch and includes a quantum dot light-emitting diode; and a light sensor, which is disposed on the substrate and coupled to the second active switch and includes a quantum dot light sensing layer.

Optionally, the light sensor is a PIN type photodiode.

Optionally, the quantum dot light-emitting diode includes a pixel unit electrode layer, a quantum dot layer, and a cathode layer which are sequentially arranged from the direction of the substrate;

the quantum dot layer is disposed between the pixel unit electrode layer and the cathode layer, the pixel unit electrode layer is used as an anode of the quantum dot layer, and the cathode layer serves as a cathode of the quantum dot layer.

Optionally, the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;

the pixel unit electrode layer includes a first pixel unit electrode layer disposed above the drain layer, and the quantum dot layer is disposed above the first pixel unit electrode layer of the first active switch.

Optionally, the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate.

Optionally, the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;

the pixel unit electrode layer includes a first pixel unit electrode layer disposed above the drain layer, and the quantum dot layer is disposed above the first pixel unit electrode layer of the first active switch;

the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate.

Optionally, the quantum dot light-emitting diode includes a pixel unit electrode layer, a quantum dot layer, and a cathode layer which are sequentially arranged from the direction of the substrate;

the quantum dot layer is disposed between the pixel unit electrode layer and the cathode layer, the pixel unit electrode layer is used as an anode of the quantum dot layer, and the cathode layer serves as a cathode of the quantum dot layer;

the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;

the pixel unit electrode layer includes a first pixel unit electrode layer disposed above the drain layer, and the quantum dot layer is disposed above the first pixel unit electrode layer of the first active switch;

the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate.

Optionally, the quantum dot light sensing layer includes a mesoporous framework, the mesoporous framework is a self-assembled mesoporous silica framework, holes are formed in the mesoporous framework, and quantum dots are disposed in the holes.

Optionally, the hole has a diameter of 2-7 nm.

Optionally, the inner wall of the hole is a silicon dioxide hole wall, and the hole wall has a thickness of 1-2 nm.

Optionally, the holes include a plurality of first holes, second holes and third holes, where the diameter of the second hole is smaller than that of the first hole, and the diameter of the third hole is smaller than that of the second hole.

Optionally, the quantum dot light sensing layer includes a mesoporous framework, the mesoporous framework is a self-assembled mesoporous silica framework, holes are formed in the mesoporous framework, and quantum dots are disposed in the holes;

the hole has a diameter of 2-7 nm;

the inner wall of the hole is a silicon dioxide hole wall, and the hole wall has a thickness of 1-2 nm.

Optionally, the quantum dot light-emitting diode includes a pixel unit electrode layer, a quantum dot layer, and a cathode layer which are sequentially arranged from the direction of the substrate;

the quantum dot layer is disposed between the pixel unit electrode layer and the cathode layer, the pixel unit electrode layer is used as an anode of the quantum dot layer, and the cathode layer serves as a cathode of the quantum dot layer;

the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;

the pixel unit electrode layer includes a first pixel unit electrode layer disposed above the drain layer, and the quantum dot layer is disposed above the first pixel unit electrode layer of the first active switch;

the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate;

where the quantum dot light sensing layer includes a mesoporous framework, the mesoporous framework is a self-assembled mesoporous silica framework, holes are formed in the mesoporous framework, and quantum dots are disposed in the holes;

the hole has a diameter of 2-7 nm.

Optionally, the quantum dot light-emitting diode includes a pixel unit electrode layer, a quantum dot layer, and a cathode layer which are sequentially arranged from the direction of the substrate;

the quantum dot layer is disposed between the pixel unit electrode layer and the cathode layer, the pixel unit electrode layer is used as an anode of the quantum dot layer, and the cathode layer serves as a cathode of the quantum dot layer;

the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;

the pixel unit electrode layer includes a first pixel unit electrode layer disposed above the drain layer, and the quantum dot layer is disposed above the first pixel unit electrode layer of the first active switch;

the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate;

where the quantum dot light sensing layer includes a mesoporous framework, the mesoporous framework is a self-assembled mesoporous silica framework, holes are formed in the mesoporous framework, and quantum dots are disposed in the holes;

the inner wall of the hole is a silicon dioxide hole wall, and the hole wall has a thickness of 1-2 nm.

Optionally, the quantum dot light-emitting diode includes a pixel unit electrode layer, a quantum dot layer, and a cathode layer which are sequentially arranged from the direction of the substrate;

the quantum dot layer is disposed between the pixel unit electrode layer and the cathode layer, the pixel unit electrode layer is used as an anode of the quantum dot layer, and the cathode layer serves as a cathode of the quantum dot layer;

the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;

the pixel unit electrode layer includes a first pixel unit electrode layer disposed above the drain layer, and the quantum dot layer is disposed above the first pixel unit electrode layer of the first active switch;

the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate;

where the quantum dot light sensing layer includes a mesoporous framework, the mesoporous framework is a self-assembled mesoporous silica framework, holes are formed in the mesoporous framework, and quantum dots are disposed in the holes;

the hole has a diameter of 2-7 nm;

the inner wall of the hole is a silicon dioxide hole wall, and the hole wall has a thickness of 1-2 nm.

The present invention also discloses a display panel, which includes:

a substrate;

an active switch, which is disposed on the substrate and includes a first active switch and a second active switch;

a pixel unit, which is disposed on the substrate and coupled to the first active switch and includes a quantum dot light-emitting diode; and a light sensor, which is disposed on the substrate and coupled to the second active switch and includes a quantum dot light sensing layer;

where the quantum dot light-emitting diode includes a pixel unit electrode layer, a quantum dot layer, and a cathode layer which are sequentially arranged from the direction of the substrate, and the quantum dot layer is disposed above the pixel unit electrode layer of the first active switch;

where the quantum dot light sensing layer includes a mesoporous framework, the mesoporous framework is a self-assembled mesoporous silica framework, holes are formed in the mesoporous framework, and quantum dots are disposed in the holes.

The present application also discloses a display panel, which includes:

a control component and a display panel;
the display panel includes:
a substrate;
an active switch, which is disposed on the substrate and includes a first active switch and a second active switch;
a pixel unit, which is disposed on the substrate and coupled to the first active switch and includes a quantum dot light-emitting diode; and
a light sensor, which is disposed on the substrate and coupled to the second active switch and includes a quantum dot light sensing layer.

Optionally, the quantum dot light-emitting diode includes a pixel unit electrode layer, a quantum dot layer, and a cathode layer which are sequentially arranged from the direction of the substrate;
the quantum dot layer is disposed between the pixel unit electrode layer and the cathode layer, the pixel unit electrode layer is used as an anode of the quantum dot layer, and the cathode layer serves as a cathode of the quantum dot layer;
the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;
the pixel unit electrode layer includes a first pixel unit electrode layer disposed above the drain layer, and the quantum dot layer is disposed above the first pixel unit electrode layer of the first active switch;
the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate.

Optionally, the quantum dot light sensing layer includes a mesoporous framework, the mesoporous framework is a self-assembled mesoporous silica framework, holes are formed in the mesoporous framework, and quantum dots are disposed in the holes;
the hole has a diameter of 2-7 nm;
the inner wall of the hole is a silicon dioxide hole wall, and the hole wall has a thickness of 1-2 nm.

The holes include a plurality of first holes, second holes and third holes, the diameter of the second hole is smaller than that of the first hole, and the diameter of the third hole is smaller than that of the second hole.

Optionally, the light sensor is a PIN type photodiode;
the quantum dot light-emitting diode includes a pixel unit electrode layer, a quantum dot layer, and a cathode layer which are sequentially arranged from the direction of the substrate;
the quantum dot layer is disposed between the pixel unit electrode layer and the cathode layer, the pixel unit electrode layer is used as an anode of the quantum dot layer, and the cathode layer serves as a cathode of the quantum dot layer;
the active switch includes a gate layer, a gate insulating layer, an amorphous silicon layer, a metal layer and the pixel unit electrode layer which are sequentially arranged on the substrate, and the metal layer includes a source layer and a drain layer which are disposed at both ends of the amorphous silicon layer respectively;
the pixel unit electrode layer includes a first pixel unit electrode layer disposed above the drain layer, and the quantum dot layer is disposed above the first pixel unit electrode layer of the first active switch;
the quantum dot layer includes a hole injection layer, a hole transport layer, a quantum dot light-emitting layer, an electron transport layer, and an electron injection layer which are sequentially arranged. The hole injection layer is disposed on a side close to the substrate, and the electron injection layer is disposed on a side away from the substrate;
where the quantum dot light sensing layer includes a mesoporous framework, the mesoporous framework is a self-assembled mesoporous silica framework, holes are formed in the mesoporous framework, and quantum dots are disposed in the holes;
the hole has a diameter of 2-7 nm;
the inner wall of the hole is a silicon dioxide hole wall, and the hole wall has a thickness of 1-2 nm.

In the present application, the quantum dot light-emitting diode is coupled as a pixel unit to an active switch, and the light sensor containing the quantum dot light sensing layer is connected to another active switch, so that the ambient light brightness is collected by the light sensor to convert an optical signal into an electrical signal. The signal is controlled by a signal processor, and the corresponding adjustment is made when the ambient light changes, to achieve the purpose of adjusting the display brightness, and the device is reasonably utilized to improve the display taste and enhance the user's visual experience. The quantum dot light sensing layer typically contains materials for fabricating light sensors such as photodiodes, and at the same time the quantum dot light sensing layer has spectral adjustability and environmental stability.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
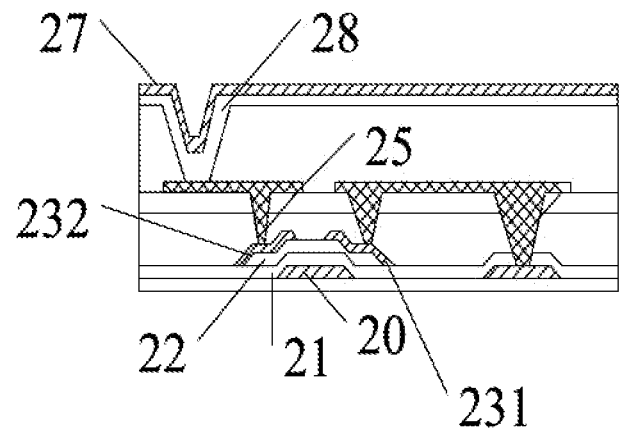
FIG. 1 is a schematic structural view of a display panel according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right". "vertical", "horizontal", "top". "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms "first", "second" are merely for a descriptive purpose, and cannot to be understood to indicate or imply a relative importance, or implicitly indicate the number of the indicated technical features. Hence, the features defined by "first", "second" can explicitly or implicitly include one or more of the features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood for those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the figures, structurally similar units are denoted by the same reference numerals.

The display panel of the present application is described in further detail below with reference to the embodiments of FIGS. 1 to 5.

As an embodiment of the present application, as shown in FIG. 1, the display panel includes:

a substrate 10;

an active switch, which is disposed on the substrate 10 and includes a first active switch and a second active switch;

a pixel unit, which is disposed on the substrate 10 and coupled to the first active switch and includes a quantum dot light-emitting diode; and a light sensor, which is disposed on the substrate and coupled to the second active switch and includes a quantum dot light sensing layer. The quantum dot light-emitting diode (QLED) is coupled as a pixel unit to an active switch, and the light sensor containing the quantum dot light sensing layer is connected to another active switch, so that the ambient light brightness is collected by the light sensor to convert an optical signal into an electrical signal. The signal is controlled by a signal processor, and the corresponding adjustment is made when the ambient light changes, to achieve the purpose of adjusting the display brightness, and the device is reasonably utilized to improve the display taste and enhance the user's visual experience. The quantum dot light sensing layer typically contains materials for fabricating light sensors such as photodiodes, and at the same time the quantum dot light sensing layer has spectral adjustability and environmental stability.

As another embodiment of the present application, as shown in FIG. 1, the display panel includes a substrate 10; an active switch, which is disposed on the substrate 10 and includes a first active switch and a second active switch; a pixel unit, which is disposed on the substrate 10 and coupled to the first active switch and includes a quantum dot light-emitting diode; and a light sensor, which is disposed on the substrate and coupled to the second active switch and includes a quantum dot light sensing layer.

The quantum dot light-emitting diode includes a first pixel unit electrode layer 25, a quantum dot layer 26, and a cathode layer 27 which are sequentially arranged from the direction of the substrate 10; the quantum dot layer 26 is disposed between the first pixel unit electrode layer 25 and the cathode layer 27, the first pixel unit electrode layer 25 serves as an anode of the quantum dot layer 26, and the cathode layer 27 serves as a cathode of the quantum dot layer 26. The active switch includes a gate layer 20, a gate insulating layer 21, an amorphous silicon layer 22, a metal layer 23 and the pixel unit electrode layer which are sequentially arranged on the substrate 10, and the metal layer 23 includes a source layer 231 and a drain layer 232 which are disposed at both ends of the amorphous silicon layer 22 respectively. The quantum dot light-emitting diode includes a first pixel unit electrode layer 25 disposed above the drain layer 232, and the quantum dot layer 26 is disposed above the first pixel unit electrode layer 25 of the first active switch. The coupling of the QLED as the pixel unit and the active switch is achieved in the form of sharing the first pixel unit electrode layer 25 (ITO). An active switch can be coupled to a corresponding pixel, which can be utilized reasonably to reduce occupied space and reduce cost while playing normal functions of the two devices.

The quantum dot light-emitting diode (QLED) is coupled as a pixel unit to an active switch, and the light sensor containing the quantum dot light sensing layer is connected to another active switch, so that the ambient light brightness is collected by the light sensor to convert an optical signal into an electrical signal. The signal is controlled by a signal processor, and the corresponding adjustment is made when the ambient light changes, to achieve the purpose of adjusting the display brightness, and the device is reasonably utilized to improve the display taste and enhance the user's visual experience. The quantum dot light sensing layer typically contains materials for fabricating light sensors such as photodiodes, and at the same time the quantum dot light sensing layer has spectral adjustability and environmental stability.

As another embodiment of the present application, as shown in FIGS. 1-4, the display panel includes a substrate 10; an active switch, which is disposed on the substrate 10 and includes a first active switch and a second active switch; a pixel unit, which is disposed on the substrate 10 and coupled to the first active switch and includes a quantum dot light-emitting diode; and a light sensor, which is disposed on the substrate and coupled to the second active switch and includes a quantum dot light sensing layer.

The quantum dot light-emitting diode includes a first pixel unit electrode layer 25, a quantum dot layer 26, and a cathode layer 27 which are sequentially arranged from the direction of the substrate 10; the quantum dot layer 26 is disposed between the first pixel unit electrode layer 25 and the cathode layer 27, the first pixel unit electrode layer 25 serves as an anode of the quantum dot layer 26, and the cathode layer 27 serves as a cathode of the quantum dot layer 26. The active switch includes a gate layer 20, a gate insulating layer 21, an amorphous silicon layer 22, a metal layer 23 and the pixel unit electrode layer which are sequentially arranged on the substrate 10, and the metal layer 23 includes a source layer 231 and a drain layer 232 which are disposed at both ends of the amorphous silicon layer 22 respectively. The quantum dot light-emitting diode includes a first pixel unit electrode layer 25 disposed above the drain layer 232, and the quantum dot layer 26 is disposed above the first pixel unit electrode layer 25 of the first active switch. The coupling of the QLED as the pixel unit and the active switch is achieved in the form of sharing the first pixel unit electrode layer 25 (TO). An active switch can be coupled to a corresponding pixel, which can be utilized reasonably to reduce occupied space and reduce cost while playing normal functions of the two devices.

The quantum dot light-emitting diode (QLED) is coupled as a pixel unit to an active switch, and the light sensor containing the quantum dot light sensing layer is connected to another active switch, so that the ambient light brightness is collected by the light sensor to convert an optical signal into an electrical signal. The signal is controlled by a signal processor, and the corresponding adjustment is made when the ambient light changes, to achieve the purpose of adjusting the display brightness, and the device is reasonably utilized to improve the display taste and enhance the user's visual experience. The quantum dot light sensing layer typically contains materials for fabricating light sensors such as photodiodes, and at the same time the quantum dot light sensing layer has spectral adjustability and environmental stability.

Figure 2:
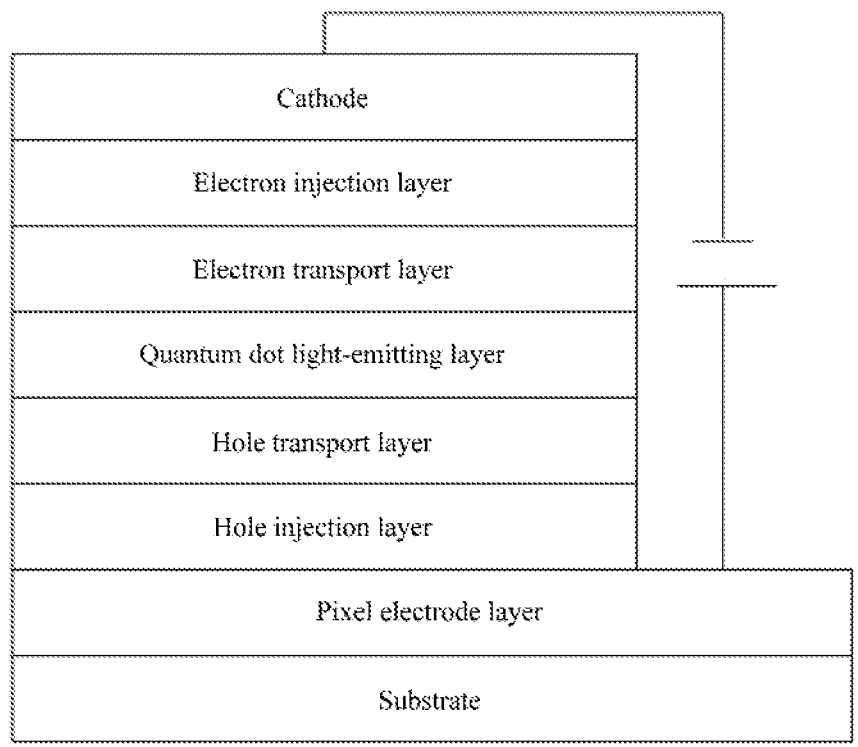
FIG. 2 is a working principle view of a quantum dot light sensing layer of a display panel according to an embodiment of the present application.

The quantum dot layer 26 includes a hole injection layer, a hole transport layer, a quantum dot light-emitting layer, an electron transport layer, and an electron injection layer which are sequentially arranged. The hole injection layer is disposed on a side close to the substrate 10, and the electron injection layer is disposed on a side away from the substrate 10. As shown in FIG. 2, from charge injection, first, when a positive outward bias is applied, holes and electrons overcome interface energy barrier, are injected through an anode and a cathode, and enter the valence band level of the hole transport layer and a conduction band of the electron transport layer respectively; then, under external driving, the holes and the electrons are transmitted through the hole transport layer and the electron transport layer to reach the quantum dots of the light-emitting layer; at this time, due to the energy level difference of the interface, the interface has a charge accumulation; and finally, after the electrons and the holes converge in quantum dots and are recombined, an exciton is formed. The sub-excited state is unstable in the general environment. The energy will be released in the form of light or heat and return to a stable ground state, and thus electroluminescence is a current-driven phenomenon.

Figure 3:
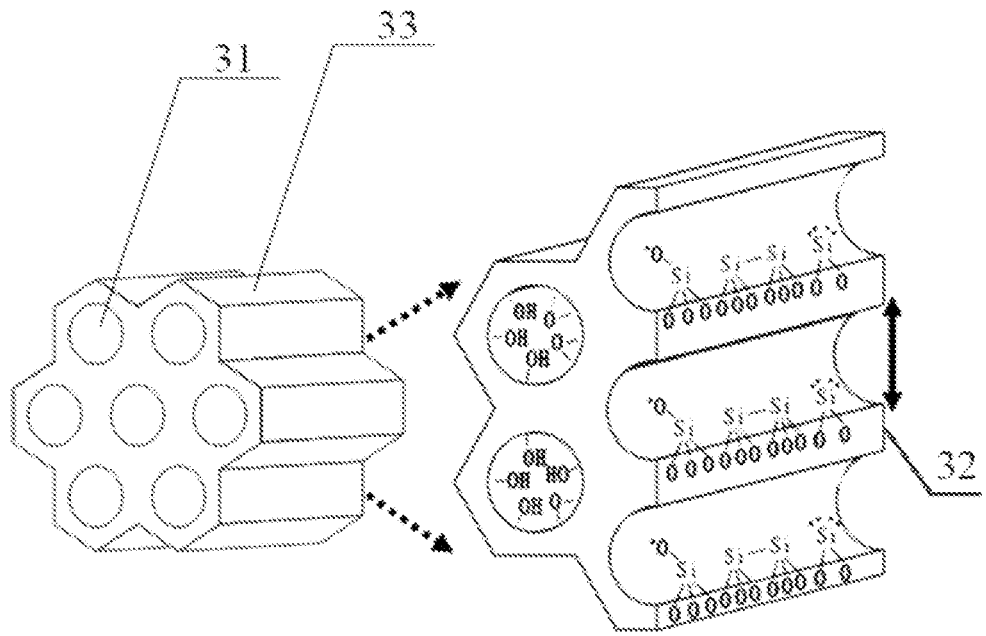
FIG. 3 is a schematic structural view of a mesoporous framework of a display panel according to an embodiment of the present application.

As shown in FIG. 3, the quantum dot light sensing layer includes a mesoporous framework 33, the mesoporous framework 33 is a self-assembled mesoporous silica framework, holes 31 are formed in the mesoporous framework 33, and quantum dots are disposed in the holes 31. By arranging quantum dots in the mesoporous framework 33 and adjusting and controlling the size of the quantum dots and the uniformity of the arrangement thereof, and adjusting the light-emitting diodes having different illuminating colors due to different quantum dot sizes, the uniformity of the color having different illuminating colors in the active illuminating display panel can be achieved, thereby improving the display taste and the user's visual experience. This is a specific silica frame structure, and the use of the structure of the hole 31 facilitates the implementation of a self-assembled molecular template solution oxide. The molecular template has a good shaping effect, and the quantum dots can be more evenly dispersed in the slit formed between the organic template and the inner wall of the hole 31. The hole 31 has a diameter of 2-7 nm. The inner wall of the hole 31 is a silicon dioxide hole wall 32, and the hole wall 32 has a thickness of 1-2 nm. Hydroxyl groups are combined with the materials employed by the quantum dots by van der Waals forces to form quantum dots in the mesoporous framework 3.

Optionally, the holes include a plurality of first holes, second holes and third holes, where the diameter of the second hole is smaller than that of the first hole, and the diameter of the third hole is smaller than that of the second hole. Specifically, the diameter of the first hole may be 5-7 nm, the diameter of the second hole is 3.5-5 nm, the diameter of the third hole is 2-3.5 nm, and materials forming the hole wall or the like may be the same or different, as long as the materials are suitable. In this way, the diameters of the holes have a large range, and the small holes and the large holes can be combined with quantum dots or other materials having different molecular material sizes, respectively, thereby expanding the scope of application of the present invention.

The quantum dot uses a III-V compound semiconductor material nano material, and the III-V compound semiconductor material includes gallium arsenide;

alternatively, the quantum dots are made of gallium nitride nanomaterials;

alternatively, the quantum dots are made of indium gallium zinc oxide nanomaterials;

alternatively, the quantum dots are made of silicon nanomaterials;

alternatively, the quantum dots are made of germanium nanomaterials; the quantum dots are made of any combination of the above nanomaterials or any of the above nanomaterials.

The organic template is made of a III-V compound semiconductor material, and the III-V compound semiconductor material includes gallium arsenide; or the organic template is made of gallium nitride; or the organic template is made of silicon; or the organic template is made of ruthenium; or the organic template is made of silicon germanium; and the organic template is made of any combination of the above materials or any of the above materials.

The radius of the quantum dot is smaller than or equal to the exciton Bohr radius. Since the radius is smaller than or equal to the exciton Bohr radius of the material, the quantum dots have a very significant quantum confinement effect. In quantum dots with small physical dimensions, since the movement of carriers in all directions is limited, the original continuous energy band structure will become a quasi-discrete energy level, which will increase the effective band gap of the material and then radiate photons with higher energy and shorter wavelengths. It is not difficult to see that for quantum dots of the same material, as the physical size reduces continuously, the emission spectrum can achieve the transition from red light to blue light, which also creates the most striking feature of quantum dots—spectral adjustability. In addition, the quantum dot emission spectrum has a narrow half peak width and good color purity and color saturation. Moreover, the quantum dots are made of inorganic semiconductor materials with environmental stability that organic chromophores cannot achieve. The quantum dots adopt a III-V such as GaAs and GaN, Si, Ge, and SiGe as a guest to make hydroxyl group (—OH) function groups converted into a framework portion of mesoporous silica on the surface of the hole 31.

Figure 4:
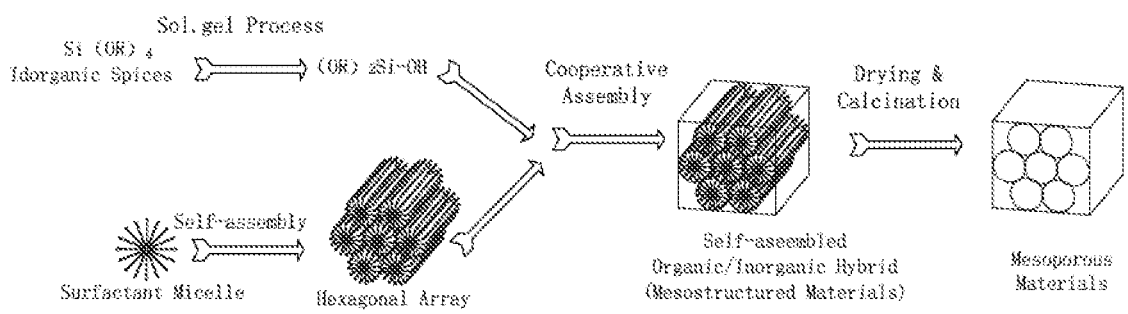
FIG. 4 is a schematic view showing steps of forming a mesoporous material in a display panel according to an embodiment of the present application.

As shown in FIG. 4, inorganic fragrance Si(OR)4 is converted into Si(OR)3Si—OH by a sol-gel process, and on the other hand, surfactant micelles are arranged into a hexagonal micelle rod by self-assembly techniques. The hexagonal micelle rod and Si(OR)3Si—OH are self-assembled by a synergistic assembly technique to form an organic/inorganic hybrid mesoporous structure material, which is then dried and calcined to form a mesoporous material.

Specifically, the light sensor is a PIN type photodiode. The PIN type photodiode includes a P-type semiconductor layer, an intrinsic semiconductor layer, and an N-type semiconductor layer which are sequentially arranged from the direction of the substrate.

Specifically, the active switch can adopt a thin film transistor.

Figure 5:
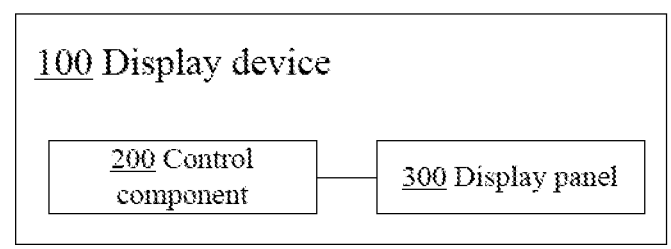
FIG. 5 is a schematic diagram of a display device according to an embodiment of the present application.

As a further embodiment of the present application, referring to FIG. 5, this embodiment discloses a display device 100. The display device 100 includes a control unit 200 and the display panel 300 of the present application. The display panel is taken as an example for detailed description above. It should be noted that the above description of the structure of the display panel is also applicable to a display device of the embodiment of the present application. When the display device of the embodiment of the present application is a liquid crystal display, the liquid crystal display includes a backlight module, and the backlight module can be used as a light source for providing sufficient brightness and light with uniform distribution. The backlight module of this embodiment can be of a front light type, may also be of a backlight type. It should be noted that the backlight module of this embodiment is not limited thereto.

The above are further detailed descriptions of the present application in conjunction with the specific embodiments, but the embodiments of the present application are not limited to these descriptions. For a person skilled in the art to which the present application pertains, a number of simple deductions or substitutions may also be made without departing from the concept of the present application. All these should be considered as falling within the scope of protection of the present application.

What is claimed is:

1. A display panel, comprising:
a substrate;
an active switch, which is arranged on the substrate and comprises a first active switch and a second active switch;
a pixel, which is arranged on the substrate and coupled to the first active switch and comprises a quantum dot light-emitting diode; and
a light sensor, which is arranged on the substrate and coupled to the second active switch and comprises a quantum dot light sensing layer;
wherein the light sensor is configured to detect an ambient light brightness and convert an optical signal into an electrical signal, depending on which a display brightness of the display panel is correspondingly adjusted in response to a change of the ambient light brightness;
wherein the quantum dot light sensing layer comprises a mesoporous framework, the mesoporous framework is a self-assembled mesoporous silica framework, holes are formed in the mesoporous framework, and quantum dots are disposed in the holes; and
wherein the structure of the holes is used to facilitate implementation of a self-assembled organic template solution oxide, and the quantum dots are evenly dispersed in a slit formed between an organic template and an inner wall of each of the holes, and wherein hydroxyl groups are combined with the material of the quantum dots by Van Der Waals forces to form the quantum dots in the mesoporous framework.

2. The display panel according to claim 1, wherein the quantum dot is made using a III-V compound semiconductor material nano material, which comprises at least one selected from the group consisting of the following materials: gallium arsenide, gallium nitride nanomaterial, indium gallium zinc oxide nanomaterial, silicon nanomaterial, and germanium nanomaterial;
and wherein the organic template is made using a III-V compound semiconductor material nano material, which comprises at least one selected from the group consisting of the following materials: gallium arsenide, gallium nitride, silicon, ruthenium, and silicon germanium.

3. The display panel according to claim 1, wherein the mesoporous framework is composed of a mesoporous material which is manufactured from the following process, in which inorganic fragrance Si(OR) 4 is converted into Si(OR)3Si—OH by a sol-gel process, and on the other hand surfactant micelles are arranged into a hexagonal micelle rod by a self-assembly technique, and then the hexagonal micelle rod and Si(OR)3Si—OH are self-assembled by a synergistic assembly technique to form an organic/inorganic hybrid mesoporous structure material, which is then dried and calcined to form the mesoporous material.

4. The display panel according to claim 1, wherein the quantum dots are disposed in the holes of the mesoporous framework to adjust and control a size and uniformity of arrangement of the quantum dots and to adjust light-emitting diodes having different illuminating colors due to different quantum dot sizes, thus achieving uniformity of light having different illuminating colors.

5. The display panel according to claim 1, wherein the inner wall of the hole is a silicon dioxide hole wall, and the hole wall has a thickness of 1-2 nm.

6. The display panel according to claim 1, wherein the light sensor is a PIN type photodiode.

7. The display panel according to claim 1, wherein the hole has a diameter of 2-7 nm.

8. The display panel according to claim 1, wherein the holes comprise a plurality of first holes, second holes and third holes, wherein the diameter of the second hole is smaller than that of the first hole, and the diameter of the third hole is smaller than that of the second hole.

9. The display panel according to claim 8, wherein the first holes have a diameter of 5-7 nm, the second holes have a diameter of 3.5-5 nm, and the third holes have a diameter of 2-3.5 nm.

10. The display panel according to claim 1, wherein the quantum dot light-emitting diode comprises a pixel electrode layer, a quantum dot layer, and a cathode layer which are sequentially arranged from the direction of the substrate;

the quantum dot layer is disposed between the pixel electrode layer and the cathode layer, the pixel electrode layer is used as an anode of the light sensor, and the cathode layer serves as a cathode of the light sensor.

11. The display panel according to claim 10, wherein the active switch comprises a gate layer, a gate insulating layer, an amorphous silicon layer, a metal layer and the pixel electrode layer which are sequentially arranged on the substrate, and the metal layer comprises a source layer and a drain layer which are disposed at both ends of the amorphous silicon layer respectively;
the pixel electrode layer comprises a first pixel electrode layer disposed above the drain layer, and the quantum dot layer is disposed above the first pixel electrode layer of the first active switch.

12. The display panel according to claim 10, wherein the quantum dot layer comprises a hole injection layer, a hole transport layer, a quantum dot light-emitting layer, an electron transport layer, and an electron injection layer which are sequentially arranged; the hole injection layer is arrange on a side close to the substrate, and the electron injection layer is arrange on a side away from the substrate.

13. A display panel, comprising:
a substrate;
an active switch, which is arranged on the substrate and comprises a first active switch and a second active switch;
a pixel, which is arranged on the substrate and coupled to the first active switch and includes a quantum dot light-emitting diode; and
a light sensor, which is arranged on the substrate and coupled to the second active switch and comprises a quantum dot light sensing layer, wherein the light sensor is configured to detect an ambient light brightness and convert an optical signal into an electrical signal, depending on which a display brightness of the display panel is correspondingly adjusted in response to a change of the ambient light brightness;
where the quantum dot light-emitting diode includes a pixel electrode layer, a quantum dot layer, and a cathode layer which are sequentially arranged from the direction of the substrate, and the quantum dot layer is disposed above the pixel electrode layer of the first active switch;
where the quantum dot light sensing layer includes a mesoporous framework, the mesoporous framework is a self-assembled mesoporous silica framework, holes are formed in the mesoporous framework, and quantum dots are arranged in the holes; and
wherein the structure of the holes is used to facilitate implementation of a self-assembled organic template solution oxide, and the quantum dots are evenly dispersed in a slit formed between an organic template and an inner wall of each of the holes, and wherein hydroxyl groups are combined with the material of the quantum dots by Van Der Waals forces to form the quantum dots in the mesoporous framework.

14. A display device, comprising:
a control component and a display panel;
the display panel comprises:
a substrate;
an active switch, which is arrange on the substrate and comprises a first active switch and a second active switch;
a pixel, which is arrange on the substrate and coupled to the first active switch and includes a quantum dot light-emitting diode; and
a light sensor, which is arrange on the substrate and coupled to the second active switch and includes a quantum dot light sensing layer;
wherein the light sensor is configured to detect an ambient light brightness and convert an optical signal into an electrical signal, depending on which a display brightness of the display panel is correspondingly adjusted in response to a change of the ambient light brightness;
wherein the quantum dot light sensing layer comprises a mesoporous framework, the mesoporous framework is a self-assembled mesoporous silica framework, holes are formed in the mesoporous framework, and quantum dots are disposed in the holes; and
wherein the structure of the holes is used to facilitate implementation of a self-assembled organic template solution oxide, and the quantum dots are evenly dispersed in a slit formed between an organic template and an inner wall of each of the holes, and wherein hydroxyl groups are combined with the material of the quantum dots by Van Der Waals forces to form the quantum dots in the mesoporous framework.

15. The display device according to claim 14, wherein the quantum dot light-emitting diode comprises a pixel electrode layer, a quantum dot layer, and a cathode layer which are sequentially arranged from the direction of the substrate;
the quantum dot layer is disposed between the pixel electrode layer and the cathode layer, the pixel electrode layer is used as an anode of the quantum dot layer, and the cathode layer serves as a cathode of the quantum dot layer;
the active switch includes a gate layer, a gate insulating layer, an amorphous silicon layer, a metal layer and the pixel electrode layer which are sequentially arranged on the substrate, and the metal layer includes a source layer and a drain layer which are disposed at both ends of the amorphous silicon layer respectively;
the pixel electrode layer includes a first pixel electrode layer disposed above the drain layer, and the quantum dot layer is disposed above the first pixel electrode layer of the first active switch;
the quantum dot layer includes a hole injection layer, a hole transport layer, a quantum dot light-emitting layer, an electron transport layer, and an electron injection layer which are sequentially arranged, wherein the hole injection layer is arranged on a side close to the substrate, and the electron injection layer is arranged on a side away from the substrate;
the light sensor is a PIN type photodiode;
wherein the hole has a diameter of 2-7 nm;
the inner wall of the hole is a silicon dioxide hole wall, and the hole wall has a thickness of 1-2 nm.

16. The display device according to claim 14, wherein the hole has a diameter of 2-7 nm;
the inner wall of the hole is a silicon dioxide hole wall, and the hole wall has a thickness of 1-2 nm;
wherein the holes include a plurality of first holes, second holes and third holes, wherein the diameter of the second hole is smaller than that of the first hole, and the diameter of the third hole is smaller than that of the second hole.

17. The display device according to claim 14, wherein the quantum dot light-emitting diode comprises a pixel electrode layer, a quantum dot layer, and a cathode layer which are sequentially arranged from the direction of the substrate;
the quantum dot layer is disposed between the pixel electrode layer and the cathode layer, the pixel electrode layer is used as an anode of the quantum dot layer, and the cathode layer serves as a cathode of the quantum dot layer;

the active switch includes a gate layer, a gate insulating layer, an amorphous silicon layer, a metal layer and the pixel electrode layer which are sequentially arranged on the substrate, and the metal layer includes a source layer and a drain layer which are disposed at both ends of the amorphous silicon layer respectively;

the pixel electrode layer includes a first pixel electrode layer disposed above the drain layer, and the quantum dot layer is disposed above the first pixel electrode layer of the first active switch;

the quantum dot layer includes a hole injection layer, a hole transport layer, a quantum dot light-emitting layer, an electron transport layer, and an electron injection layer which are sequentially arranged, wherein the hole injection layer is arranged on a side close to the substrate, and the electron injection layer is arranged on a side away from the substrate.

\* \* \* \* \*